United States Patent
Campbell et al.

(10) Patent No.: US 7,646,007 B2
(45) Date of Patent: Jan. 12, 2010

(54) SILVER-SELENIDE/CHALCOGENIDE GLASS STACK FOR RESISTANCE VARIABLE MEMORY

(75) Inventors: Kristy A. Campbell, Boise, ID (US); John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 117 days.

(21) Appl. No.: 11/585,259

(22) Filed: Oct. 24, 2006

(65) Prior Publication Data

US 2007/0102691 A1    May 10, 2007

Related U.S. Application Data

(60) Division of application No. 10/120,521, filed on Apr. 12, 2002, now Pat. No. 7,151,273, which is a continuation of application No. 10/077,867, filed on Feb. 20, 2002, now abandoned.

(51) Int. Cl.
*H01L 29/06* (2006.01)

(52) U.S. Cl. ............... 257/4; 257/E21.02; 257/E29.17; 438/95; 365/148

(58) Field of Classification Search ............... 257/1–4, 257/E21.02, E27.004, E29.17; 365/148, 365/100; 438/54, 95
See application file for complete search history.

(56) References Cited

U.S. PATENT DOCUMENTS

| | | | |
|---|---|---|---|
| 3,622,319 A | 11/1971 | Sharp | |
| 3,743,847 A | 7/1973 | Boland | |
| 3,753,110 A | 8/1973 | Ikeda et al. | |
| 4,115,872 A | 9/1978 | Bluhm | |
| 4,203,123 A * | 5/1980 | Shanks | 257/2 |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |

(Continued)

FOREIGN PATENT DOCUMENTS

EP    1 202285 A    5/2002

(Continued)

OTHER PUBLICATIONS

Sean L. Rommel et al.—"Room temperature operation of epitaxially grown $Si/Si_{0.5}Ge_{0.5}/Si$ resonant interband tunneling diodes" Applied Physics Letters, vol. 73, No. 15, Oct. 12, 1998, pp. 2191-2193.

(Continued)

*Primary Examiner*—Jerome Jackson, Jr.
*Assistant Examiner*—Paul A Budd
(74) *Attorney, Agent, or Firm*—Dickstein Shapiro LLP

(57) ABSTRACT

The invention is related to methods and apparatus for providing a resistance variable memory element with improved data retention and switching characteristics. According to an embodiment of the invention a resistance variable memory element is provided having at least one silver-selenide layer in between glass layers, wherein at least one of the glass layers is a chalcogenide glass, preferably having a $Ge_xSe_{100-x}$ composition.

37 Claims, 10 Drawing Sheets

U.S. PATENT DOCUMENTS

| | | | |
|---|---|---|---|
| 4,671,618 A | 6/1987 | Wu et al. |
| 4,795,657 A | 1/1989 | Formigoni et al. |
| 4,800,526 A | 1/1989 | Lewis |
| 4,847,674 A | 7/1989 | Sliwa et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,314,772 A | 5/1994 | Kozicki |
| 5,315,131 A | 5/1994 | Kishimoto et al. |
| 5,350,484 A | 9/1994 | Gardner et al. |
| 5,360,981 A | 11/1994 | Owen et al. |
| 5,363,329 A | 11/1994 | Troyan |
| 5,500,532 A | 3/1996 | Kozicki et al. |
| 5,512,328 A | 4/1996 | Yoshimura et al. |
| 5,512,773 A | 4/1996 | Wolf et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,825,046 A | 10/1998 | Klersy et al. |
| 5,837,564 A | 11/1998 | Sandhu et al. |
| 5,841,150 A | 11/1998 | Gonzalez et al. |
| 5,846,889 A | 12/1998 | Harbison et al. |
| 5,896,312 A | 4/1999 | Kozicki et al. |
| 5,914,893 A | 6/1999 | Kozicki et al. |
| 5,920,788 A | 7/1999 | Reinberg |
| 5,952,671 A | 9/1999 | Zahorik et al. |
| 5,998,066 A | 12/1999 | Block et al. |
| 6,072,716 A | 6/2000 | Jacobson et al. |
| 6,077,729 A | 6/2000 | Harshfield |
| 6,084,796 A | 7/2000 | Kozicki et al. |
| 6,117,720 A | 9/2000 | Harshfield |
| 6,143,604 A | 11/2000 | Chiang et al. |
| 6,177,338 B1 | 1/2001 | Liaw et al. |
| 6,236,059 B1 | 5/2001 | Wolstenholme et al. |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,414,376 B1 | 7/2002 | Thakur et al. |
| 6,418,049 B1 | 7/2002 | Kozicki et al. |
| 6,423,628 B1 | 7/2002 | Li et al. |
| 6,473,332 B1 | 10/2002 | Ignatiev et al. |
| 6,487,106 B1 | 11/2002 | Kozicki |
| 6,635,914 B2 * | 10/2003 | Kozicki et al. ............... 257/296 |
| 6,737,312 B2 * | 5/2004 | Moore ........................ 438/238 |
| 6,813,178 B2 | 11/2004 | Campbell et al. |
| 6,864,521 B2 | 3/2005 | Moore et al. |
| 6,867,996 B2 | 3/2005 | Campbell et al. |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0168820 A1 | 11/2002 | Kozicki et al. |
| 2002/0190350 A1 | 12/2002 | Kozicki |
| 2003/0027416 A1 | 2/2003 | Moore |
| 2003/0035314 A1 | 2/2003 | Kozicki |
| 2003/0035315 A1 | 2/2003 | Kozicki |
| 2004/0042265 A1 | 3/2004 | Moore et al. |

FOREIGN PATENT DOCUMENTS

| | | |
|---|---|---|
| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

K. Ismail et al.—Electron resonant tunneling in Si/SiGe double barrier diodes Applied Physics Letters, vol. 59, No. 8, Aug. 19, 1991, pp. 973-975.

Marc A. Kastner —"Artificial Atoms" Physics Today, Jan. 1993, pp. 24-31.

Abdel-All, A.; Elshafie,A.; Elhawary, M.M., DC electric-field effect in bulk and thin-film Ge5As38Te57 chalcogenide glass, Vacuum 59 (2000) 845-853.

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi,M.A.; Labib, H.H.; Fouad, S.S.; El-Shazly, A.A., Electrical & thermal conductivity of the amorphous semiconductor GexSe1-x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169- K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165-171.

Bernede, J.C.; Khelil, A.; Kettaf, M.; Conan, A., Transition from S- to N-type differential negative resistance in Al-Al2O3-Ag2-xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near x=⅓ in GexSe1-x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase separation in GexSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) $17^{th}$ (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L. , Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: a unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43'(l992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N. A.; Fadel, M.; Sedeek, K., Memory switching phenomena in thin films of chalcogenide semiconductors, Vacuum 45 (1994) 459-462.

Hirose, Y.; Hirose, H., Polarity-dependent memory switching and behavior of Ag dendrite in Ag-photodoped amorphous As2S3 films, J. Appl. Phys. 47 (1976) 2767-2772.

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185-C2-188.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A. Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.;Snell,A.J.; Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.; Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and and applied phys. 35 (1997) 424-427.

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semi-conductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.; Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

Axon Technologies Corporation, Technology Description: *Programmable Metalization Cell(PMC)*, pp. 1-6 (Pre-May 2000).

Helbert et al., *Intralevel hybrid resist process with submicron capability*, SPIE vol. 333 Submicron Lithography, pp. 24-29 (1982).

Hilt, Dissertation: *Materials characterization of Silver Chalcogenide Programmable Metalization Cells*, Arizona State University, pp. Title page-114 (UMI Company, May 1999).

Hirose et al., *High Speed Memory Behavior and Reliability of an Amorphous $As_2S_3$ Film Doped Ag*, Phys. Stat. Sol. (a) 61, pp. 87-90 (1980).

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Huggett et al., *Development of silver sensitized germanium selenide photoresist by reactive sputter etching in $SF_6$*, 42 Appl. Phys. Lett., No. 7, pp. 592-594 (Apr. 1983).

Kawaguchi et al., *Mechanism of photosurface deposition*, 164-166 J. Non-Cryst. Solids, pp. 1231-1234 (1993).

Kolobov and Elliott, Photodoping of Amorphous Chalcogenides by Metals, Advances in Physics, vol. 40, No. 5, 625-684 (1991).

Kozicki, et al., "Applications of Programmable Resistance Changes in Metal-doped Chalcogenides", Proceedings of the 1999 Symposium on Solid State Ionic Devices, Editors—E.D. Wachsman et al., The Electrochemical Society, Inc., 1-12 (1999).

Kozicki, et al., *Nanoscale effects in devices based on chalcogenide solid solutions*, Superlattices and Microstructures, 27, 485-488 (2000).

Kozicki, et al., *Nanoscale phase separation in Ag-Ge-Se glasses*, Microelectronic Engineering, vol. 63/1-3,155-159 (2002).

M.N. Kozicki and M. Mitkova, *Silver incorporation in thin films of selenium rich Ge-Se glasses*, Proceedings of the XIX International Congress on Glass, Society for Glass Technology, 226-227 (2001).

McHardy et al., *The dissolution of metals in amorphous chalcogenides and the effects o electron and ultraviolet radiation*, 20 J. Phys. C.: Solid State Phys., pp. 4055-4075 (1987)*f*.

Owen et al., *Metal-Chalcogenide Photoresists for High Resolution Lithography and Sub-Micron Structures*, Nanostructure Physics and Fabrication, pp. 447-451 (M. Reed ed. 1989).

Shimizu et al., *The Photo-Erasable Memory Switching Effect of Ag Photo-Doped Chalcogenide Glasses*, 46 B. Chem Soc. Japan, No. 12, pp. 3662-3365 (1973).

\* cited by examiner

SILVER-SELENIDE/CHALCOGENIDE GLASS STACK FOR RESISTANCE VARIABLE MEMORY

CROSS REFERENCE TO RELATED APPLICATIONS

The present application is a divisional of U.S. patent application Ser. No. 10/120,521, filed on Apr. 12, 2002, now U.S. Pat. No. 7,151,273 which in turn is a continuation of U.S. patent application Ser. No. 10/077,867, filed on Feb. 20, 2002 (now abandoned), the disclosures of which are incorporated by reference in their entirety.

FIELD OF THE INVENTION

The invention relates to the field of random access memory (RAM) devices formed using a resistance variable material, and in particular to a resistance variable memory element formed using chalcogenide glass.

BACKGROUND OF THE INVENTION

A well known semiconductor component is semiconductor memory, such as a random access memory (RAM). RAM permits repeated read and write operations on memory elements. Typically, RAM devices are volatile, in that stored data is lost once the power source is disconnected or removed. Non-limiting examples of RAM devices include dynamic random access memory (DRAM), synchronized dynamic random access memory (SDRAM) and static random access memory (SRAM). In addition, DRAMS and SDRAMS also typically store data in capacitors which require periodic refreshing to maintain the stored data.

In recent years, the number and density of memory elements in memory devices have been increasing. Accordingly, the size of each element has been shrinking, which in the case of DRAMs also shortens the element's data holding time. Typically, a DRAM memory device relies on element capacity for data storage and receives a refresh command in a conventional standardized cycle, about every 100 milliseconds. However, with increasing element number and density, it is becoming more and more difficult to refresh all memory elements at least once within a refresh period. In addition, refresh operations consume power.

Recently resistance variable memory elements, which includes programmable conductor memory elements, have been investigated for suitability as semi-volatile and non-volatile random access memory elements. Kozicki et al. in U.S. Pat. Nos. 5,761,115; 5,896,312; 5,914,893; and 6,084,796, discloses a programmable conductor memory element including an insulating dielectric material formed of a chalcogenide glass disposed between two electrodes. A conductive material, such as silver, is incorporated into the dielectric material. The resistance of the dielectric material can be changed between high resistance and low resistance states. The programmable conductor memory is normally in a high resistance state when at rest. A write operation to a low resistance state is performed by applying a voltage potential across the two electrodes. The mechanism by which the resistance of the element is changed is not fully understood. In one theory suggested by Kozicki et al., the conductively-doped dielectric material undergoes a structural change at a certain applied voltage with the growth of a conductive dendrite or filament between the electrodes effectively interconnecting the two electrodes and setting the memory element in a low resistance state. The dendrite is thought to grow through the resistance variable material in a path of least resistance.

The low resistance state will remain intact for days or weeks after the voltage potentials are removed. Such material can be returned to its high resistance state by applying a reverse voltage potential between the electrodes of at least the same order of magnitude as used to write the element to the low resistance state. Again, the highly resistive state is maintained once the voltage potential is removed. This way, such a device can function, for example, as a resistance variable memory element having two resistance states, which can define two logic states.

One preferred resistance variable material comprises a chalcogenide glass. A specific example is germanium-selenide ($Ge_xSe_{100-x}$) comprising silver (Ag). One method of providing silver to the germanium-selenide composition is to initially form a germanium-selenide glass and then deposit a thin layer of silver upon the glass, for example by sputtering, physical vapor deposition, or other known techniques in the art. The layer of silver is irradiated, preferably with electromagnetic energy at a wavelength less than 600 nanometers, so that the energy passes through the silver and to the silver/glass interface, to break a chalcogenide bond of the chalcogenide material such that the glass is doped or photodoped with silver. Silver may also be provided to the glass by processing the glass with silver, as in the case of a silver-germanium-selenide glass. Another method for providing metal to the glass is to provide a layer of silver-selenide on a germanium-selenide glass.

In accordance with the current methods of incorporating silver into the glass, the degree and nature of the crystallinity of the chalcogenide material of the memory element has a direct bearing upon its programming characteristics. Accordingly, current processes for incorporating silver require the precise control of the amounts of $Ge_xSe_{100-x}$ glass and silver, so as not to incorrectly dope the glass and improperly alter the crystallinity of the chalcogenide material. Current processes also require careful selection of the exact stoichiometry of the glass to ensure that silver is incorporated into the glass while the glass backbone remains in the glass forming region.

Furthermore, during semiconductor processing and/or packaging of a fabricated original structure that incorporates the memory element, the element undergoes thermal cycling or heat processing. Heat processing can result in substantial amounts of silver migrating into the memory element uncontrollably. Too much silver incorporated into the memory element may result in faster degradation, i.e., a short life, and eventually device failure.

Accordingly, there is a need for a resistance variable memory element having improved memory retention and switching characteristics. There is also a need for a chalcogenide glass memory element that is resistant to silver migration during thermal processing.

BRIEF SUMMARY OF THE INVENTION

In a first embodiment, the invention provides a resistance variable memory element and a method of forming the resistance variable memory element in which a metal containing layer is formed between a first chalcogenide glass layer and a second glass layer. One or both of the glass layers may be doped with a metal and one or more metal containing layers may be provided between the glass layers.

In a narrower aspect of the first embodiment, the invention provides a memory element and a method of forming the memory element in which at least one layer of silver-selenide is formed between a first chalcogenide glass layer and a second glass layer. The second glass layer may also be a chalcogenide glass layer. The stack of layers comprising a first chalcogenide glass, a silver-selenide layer, and a second glass layer are formed between two conductive layers or electrodes. In a variation of the first embodiment of the invention, the stack of layers may contain more than one silver-selenide layer between the chalcogenide glass layer and the second glass layer. In another variation of the first embodiment, the first chalcogenide glass layer may contain multiple chalcogenide glass layers and the second glass layer may contain multiple glass layers. Thus the stack of layers may contain one or more silver selenide layers in serial contact with each other formed between a multi-layered chalcogenide glass layer and a multi-layered second glass layer. In yet another variation of the first embodiment, one or more of each of the first chalcogenide glass layers and the second glass layers may contain a metal dopant, for example, a silver dopant.

According to a second embodiment, the invention provides a memory element and a method of forming a memory element comprising a plurality of alternating layers of chalcogenide glass and metal containing layers, whereby the layers start with a first chalcogenide glass layer and end with a last chalcogenide glass layer, with the first chalcogenide glass layer contacting a first electrode and the last chalcogenide glass layer contacting a second electrode. Thus, the plurality of alternating layers of chalcogenide glass layers and metal containing layers are stacked between two electrodes. The metal containing layers preferably comprises a silver-chalcogenide, such as silver-selenide. In a variation of the second embodiment, the metal containing layers may each contain a plurality of metal containing layers. In another variation of the second embodiment, the chalcogenide glass layers may each contain a plurality of chalcogenide glass layers. In yet another variation of this embodiment, one or more of the chalcogenide glass layers may contain a metal dopant, for example, a silver dopant.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including but not limited to a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The term "semi-volatile memory" is intended to include any memory device or element which is capable of maintaining its memory state after power is removed from the device for a prolonged period of time. Thus, semi-volatile memory devices are capable of retaining stored data after the power source is disconnected or removed. Accordingly, the term "semi-volatile memory" is also intended to include not only semi-volatile memory devices, but also non-volatile memory devices.

The term "resistance variable material" is intended to include chalcogenide glasses, and chalcogenide glasses comprising a metal, such as silver. For instance the term "resistance variable material" includes silver doped chalcogenide glasses, silver-germanium-selenide glasses, and chalcogenide glass comprising a silver selenide layer.

The term "resistance variable memory element" is intended to include any memory element, including programmable conductor memory elements, semi-volatile memory elements, and non-volatile memory elements which exhibit a resistance change in response to an applied voltage.

The term "chalcogenide glass" is intended to include glasses that comprise an element from group VIA (or group 16) of the periodic table. Group VIA elements, also referred to as chalcogens, include sulfur (S), selenium (Se), tellurium (Te), polonium (Po), and oxygen (O).

Figure 1:
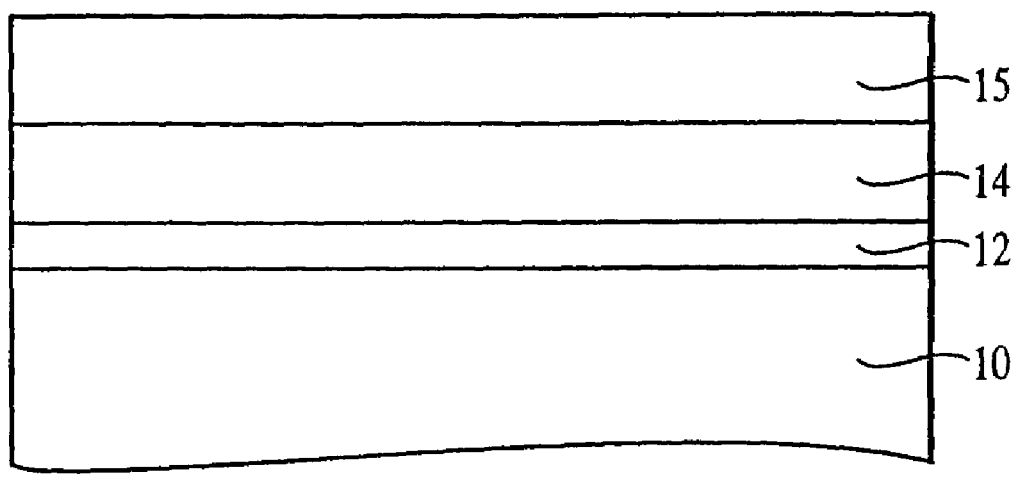
FIG. 1 illustrates a cross-sectional view of a memory element fabricated in accordance with a first embodiment of the invention and at an initial stage of processing.

The invention will now be explained with reference to FIGS. 1-10, which illustrate exemplary embodiments of a resistance variable memory element 100 in accordance with the invention. FIG. 1 depicts a portion of an insulating layer 12 formed over a semiconductor substrate 10, for example, a silicon substrate. It should be understood that the resistance variable memory element can be formed on a variety of substrate materials and not just semiconductor substrates such as silicon. For example, the insulating layer 12 may be formed on a plastic substrate. The insulating layer 12 may be formed by any known deposition methods, such as sputtering by chemical vapor deposition (CVD), plasma enhanced CVD (PECVD) or physical vapor deposition (PVD). The insulating layer 12 may be formed of a conventional insulating oxide, such as silicon oxide ($SiO_2$), a silicon nitride ($Si_3N_4$), or a low dielectric constant material, among many others.

A first electrode 14 is next formed over the insulating layer 12, as also illustrated in FIG. 1. The first electrode 14 may comprise any conductive material, for example, tungsten, nickel, tantalum, aluminum, platinum, or silver, among many others. A first dielectric layer 15 is next formed over the first electrode 14. The first dielectric layer 15 may comprise the same or different materials as those described above with reference to the insulating layer 12.

Figure 2:
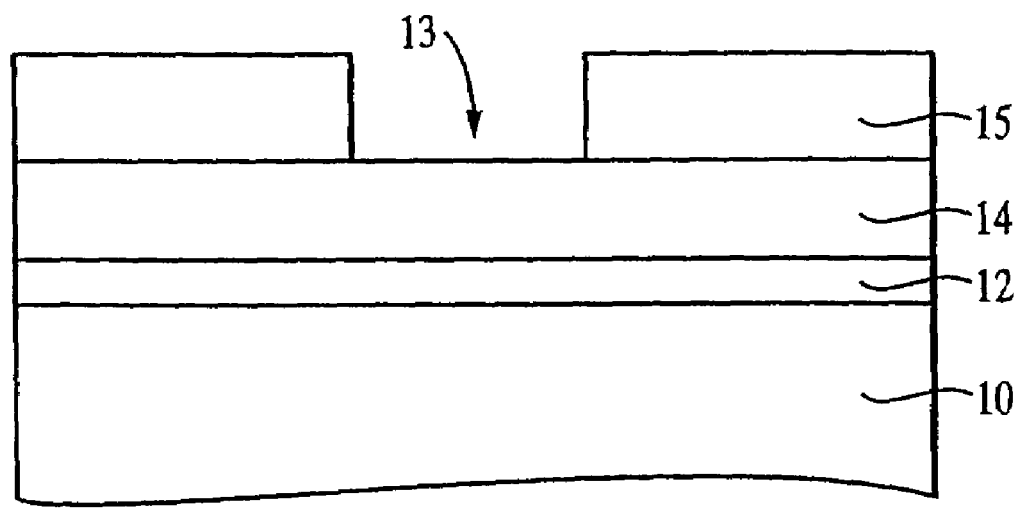
FIG. 2 illustrates a cross-sectional view of the memory element of FIG. 1 at a stage of processing subsequent to that shown in FIG. 1.
Figure 3:
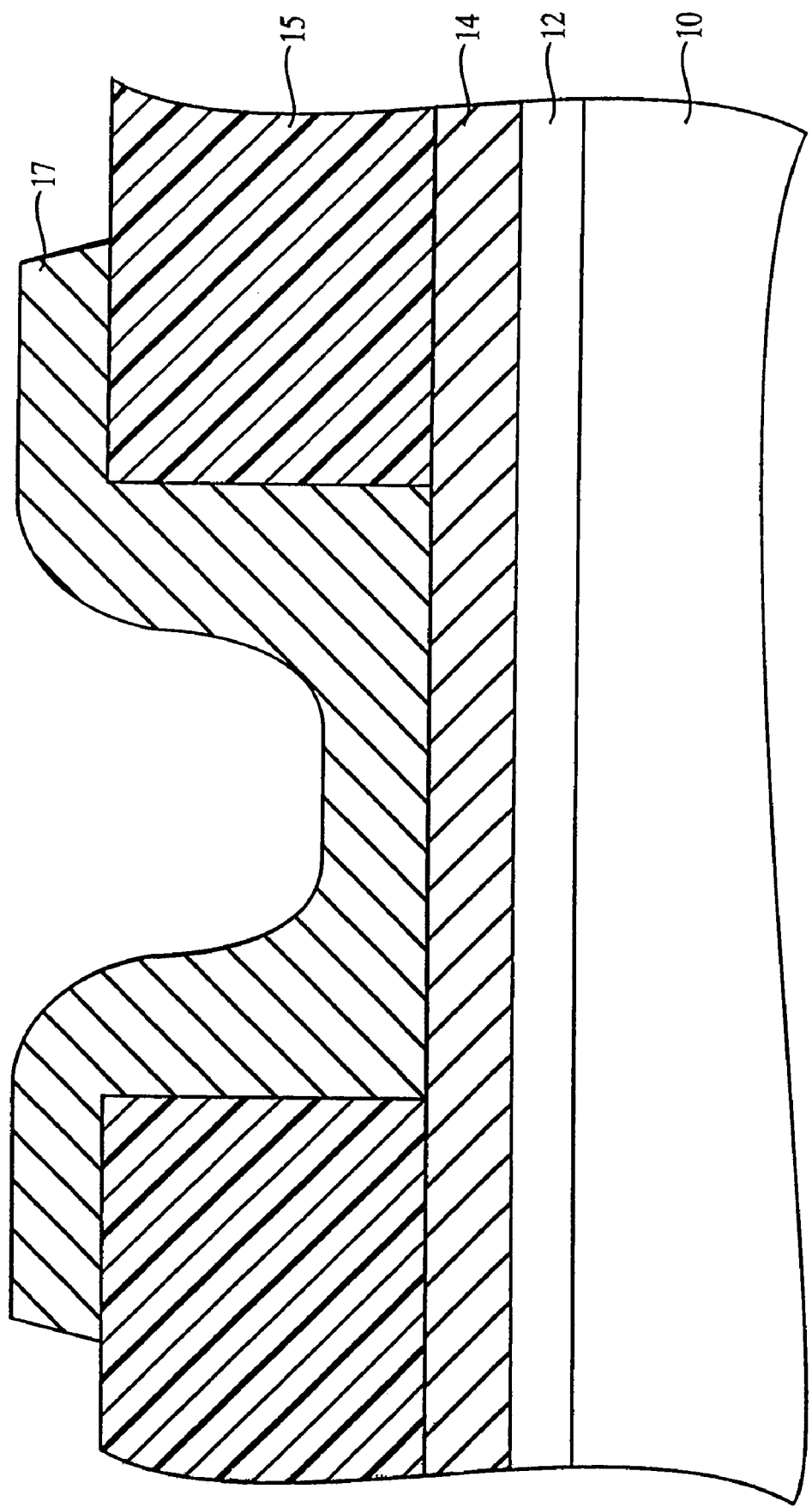
FIG. 3 illustrates a cross-sectional view of the memory element of FIG. 1 at a stage of processing subsequent to that shown in FIG. 2.

Referring now to FIG. 2, an opening 13 extending to the first electrode 14 is formed in the first dielectric layer 15. The opening 13 may be formed by known methods in the art, for example, by a conventional patterning and etching process. A first chalcogenide glass layer 17 is next formed over the first dielectric layer 15, to fill in the opening 13, as shown in FIG. 3.

According to a first embodiment of the invention, the first chalcogenide glass layer 17 is a germanium-selenide glass having a $Ge_xSe_{100-x}$ stoichiometry. The preferred stoichiometric range is between about $Ge_{20}Se_{80}$ to about $Ge_{43}Se_{57}$ and is more preferably about $Ge_{40}Se_{60}$. The first chalcogenide glass layer 17 preferably has a thickness from about 100 Å to about 1000 Å and is more preferably 150 Å.

The first chalcogenide glass layer, acts as a glass backbone for allowing a metal containing layer, such as a silver-selenide layer, to be directly deposited thereon. The use of a metal containing layer, such as a silver-selenide layer, in contact with the chalcogenide glass layer makes it unnecessary to provide a metal (silver) doped chalcogenide glass, which would require photodoping of the substrate with ultraviolet radiation. However, it is possible to also metal (silver) dope the chalcogenide glass layer, which is in contact with the silver-selenide layer, as an optional variant.

The formation of the first chalcogenide glass layer 17, having a stoichiometric composition in accordance with the invention may be accomplished by any suitable method. For instance, evaporation, co-sputtering germanium and selenium in the appropriate ratios, sputtering using a germanium-selenide target having the desired stoichiometry, or chemical vapor deposition with stoichiometric amounts of $GeH_4$ and $SeH_2$ gases (or various compositions of these gases), which result in a germanium-selenide film of the desired stoichiometry are examples of methods which may be used to form the first chalcogenide glass layer 17.

Figure 4:
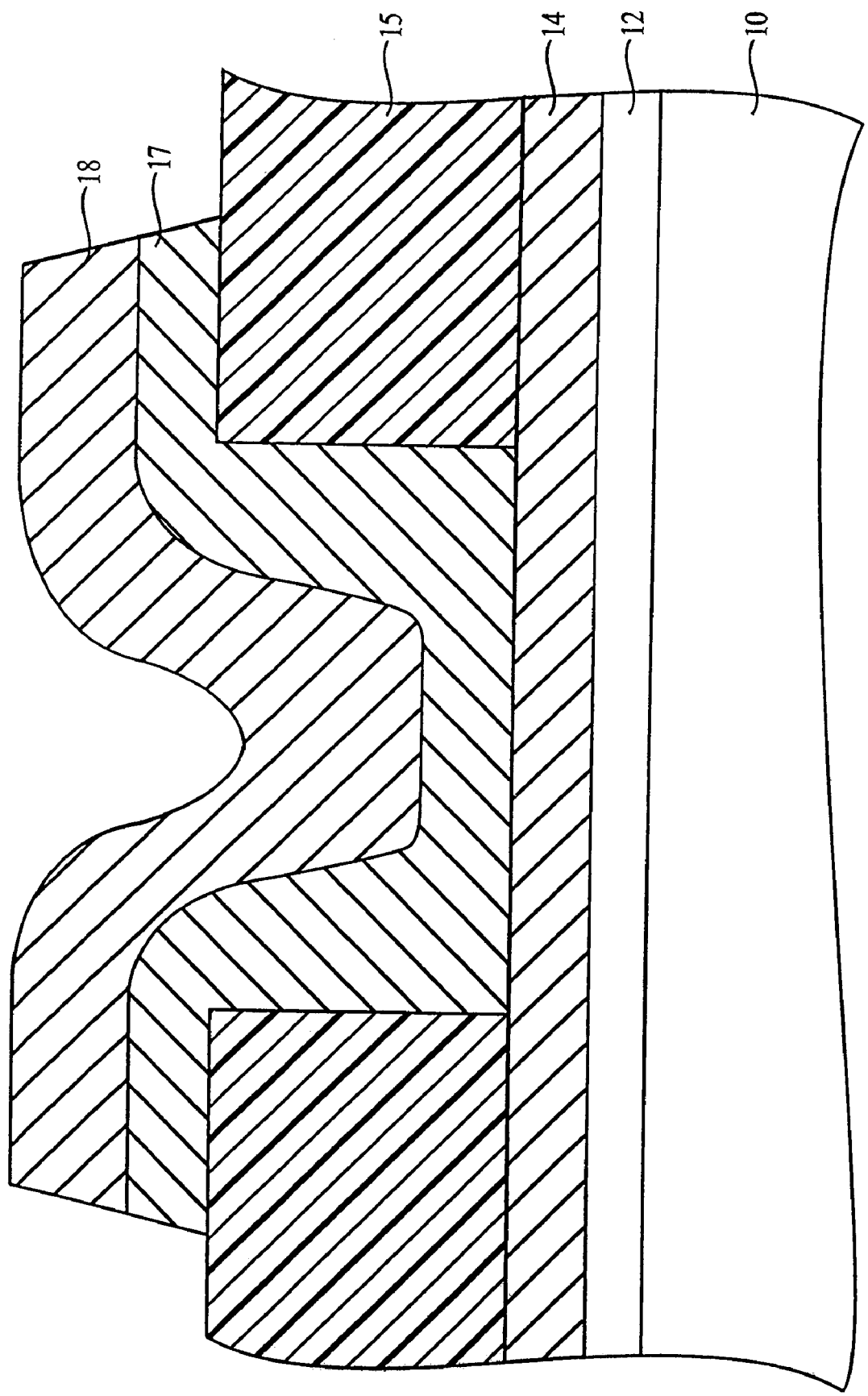
FIG. 4 illustrates a cross-sectional view of the memory element of FIG. 1 at a stage of processing subsequent to that shown in FIG. 3.

Referring now to FIG. 4, a first metal containing layer 18, preferably silver-selenide, is deposited over the first chalcogenide glass layer 17. Any suitable metal containing layer may be used. For instance, suitable metal containing layers include silver-chalcogenide layers. Silver sulfide, silver oxide, and silver telluride are all suitable silver-chalcogenides that may be used in combination with any suitable chalcogenide glass layer. A variety of processes can be used to form the silver-selenide layer 18. For instance, physical vapor deposition techniques such as evaporative deposition and sputtering may be used. Other processes such as chemical vapor deposition, co-evaporation or depositing a layer of selenium above a layer of silver to form silver-selenide can also be used.

The layers may be any suitable thickness. The thickness of the layers depend upon the mechanism for switching. The thickness of the layers is such that the metal containing layer is thicker than the first chalcogenide glass layer. The metal containing layer is also thicker than a second glass layer, described below. More preferably, the thickness of the layers are such that a ratio of the silver-selenide layer thickness to the first chalcogenide glass layer thickness is between about 5:1 and about 1:1. In other words, the thickness of the silver-selenide layer is between about 1 to about 5 times greater than the thickness of the first chalcogenide glass layer. Even more preferably, the ratio is between about 3.1:1 and about 2:1 silver-selenide layer thickness to first chalcogenide glass layer thickness.

Figure 5:
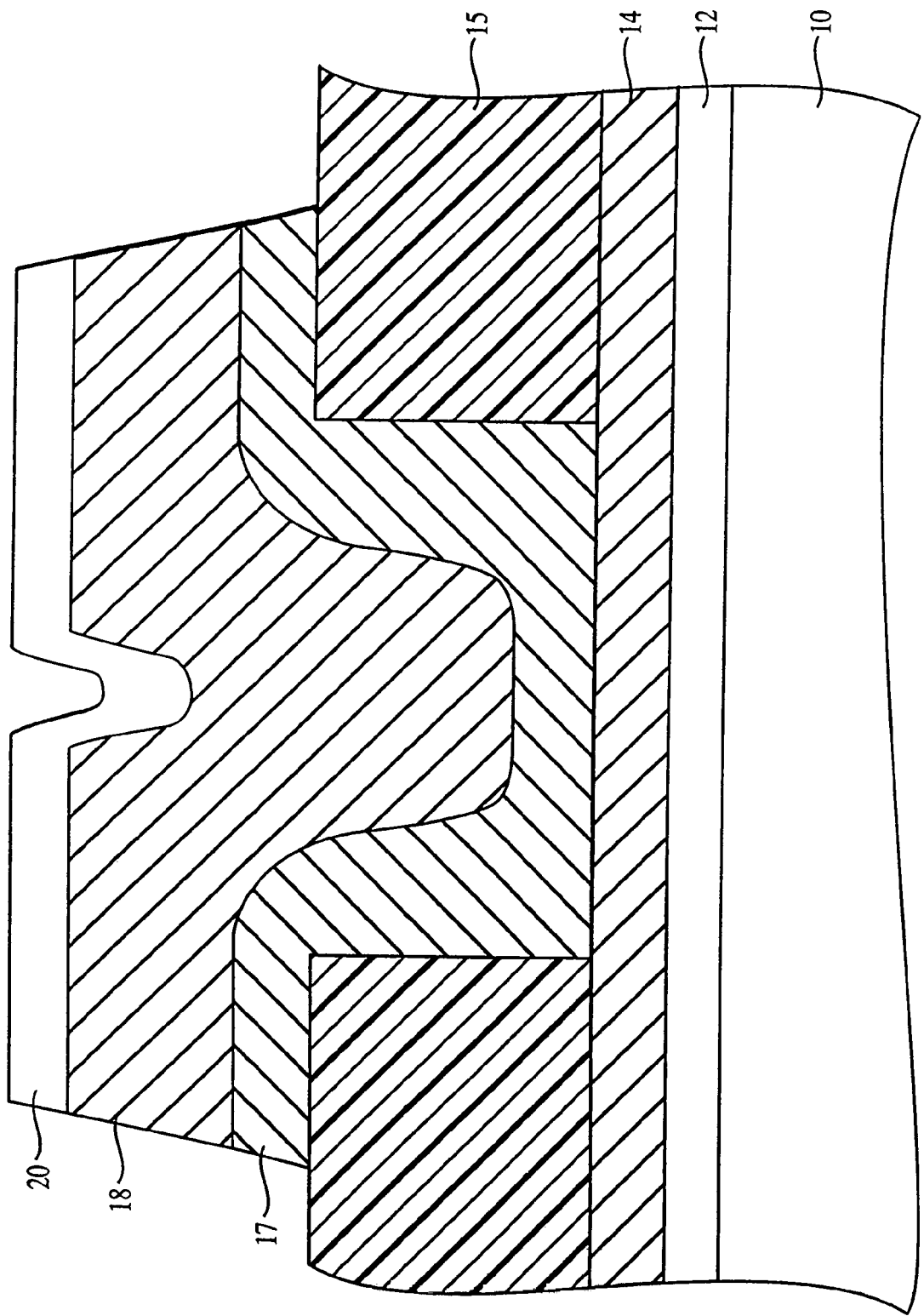
FIG. 5 illustrates a cross-sectional view of the memory element of FIG. 1 at a stage of processing subsequent to that shown in FIG. 4.

Referring now to FIG. 5 a second glass layer 20 is formed over the first silver-selenide layer 18. The second glass layer allows deposition of silver above the silver-selenide layer since silver cannot be directly deposited on silver-selenide. Also, it is believed that the second glass layer may prevent or regulate migration of metal, such as silver, from an electrode into the element. Accordingly, although the exact mechanism by which the second glass layer may regulate or prevent metal migration is not clearly understood, the second glass layer may act as a silver diffusion control layer. For use as a diffusion control layer, any suitable glass may be used, including but not limited to chalcogenide glasses. The second chalcogenide glass layer may, but need not, have the same stoichiometric composition as the first chalcogenide glass layer, e.g., GexSe100–x. Thus, the second glass layer 20 may be of a different material, different stoichiometry, and/or more rigid than the first chalcogenide glass layer 17.

The second glass layer 20, when used as a diffusion control layer may generally comprise any suitable glass material with the exception of SiGe and GaAs. Suitable glass material compositions for the second glass layer 20 include, SiSe (silicon-selenide), AsSe (arsenic-selenide, such as $As_3Se_2$), GeS (germanium-sulfide), and combinations of Ge, Ag, and Se. Any one of the suitable glass materials may further comprise small concentrations, i.e. less than about 3%, of dopants to include nitrides, metal, and other group 13-16 elements from the periodic table.

The thickness of the layers are such that the silver-selenide layer thickness is greater than the thickness of the second glass layer. Preferably, a ratio of the silver-selenide layer thickness to the second glass layer thickness is between about 5:1 and about 1:1. More preferably, the ratio of the silver-selenide layer thickness to the thickness of the second glass layer is between about 3.3:1 and about 2:1 silver-selenide layer thickness to second glass layer thickness. The second glass layer 20 preferably has a thickness between about 100 Å to about 1000 Å and is more preferably 150 Å.

The formation of the second glass layer 20 may be accomplished by any suitable method. For instance, chemical vapor deposition, evaporation, co-sputtering, or sputtering using a target having the desired stoichiometry, may be used.

Figure 6:
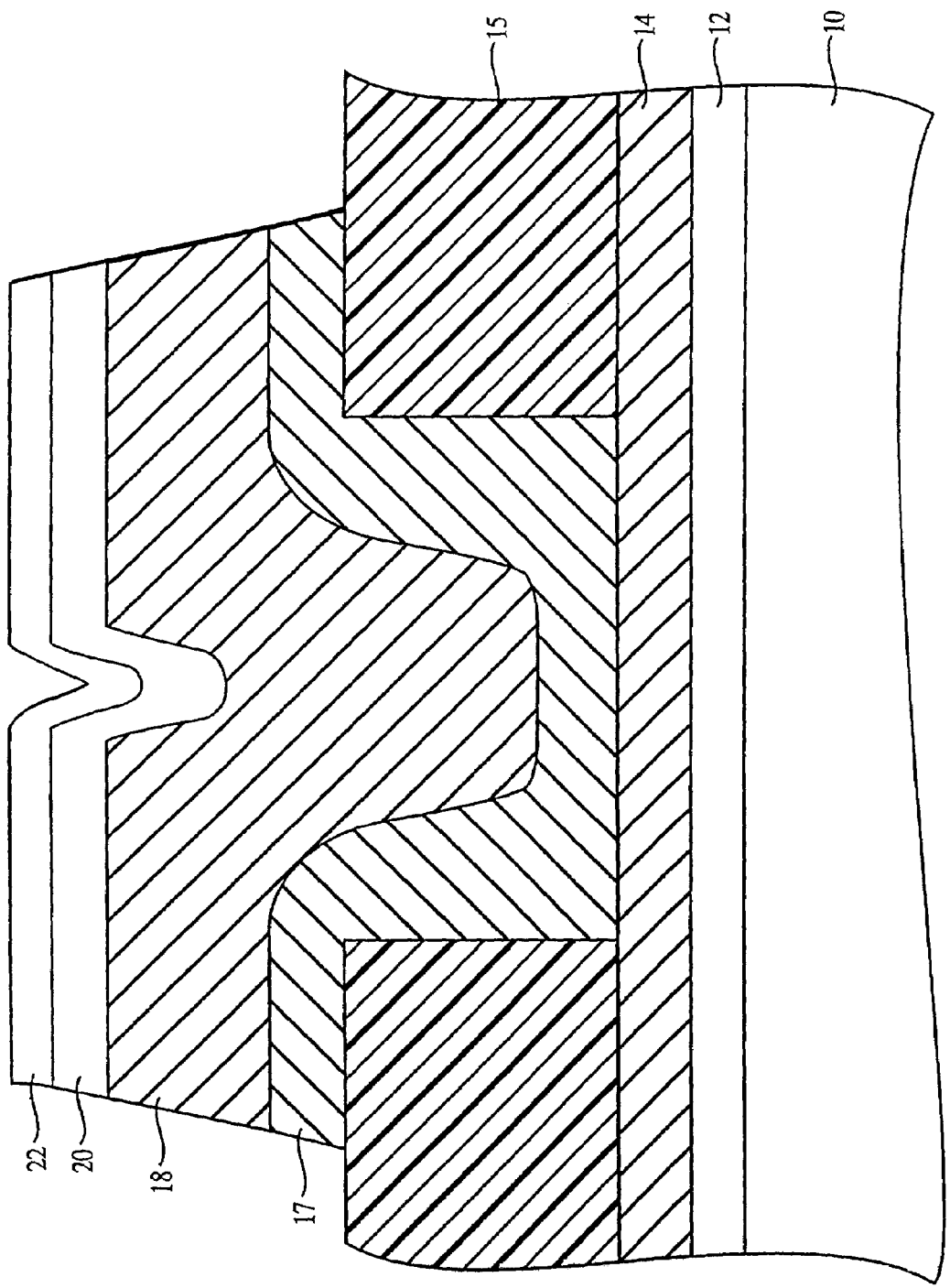
FIG. 6 illustrates a cross-sectional view of the memory element of FIG. 1 at a stage of processing subsequent to that shown in FIG. 5.

Referring now to FIG. 6, a second conductive electrode material 22 is formed over the second glass layer 20. The second conductive electrode material 22 may comprise any electrically conductive material, for example, tungsten, tantalum, titanium, or silver, among many others. Typically, the second conductive electrode material 22 comprises silver. Thus, advantageously, the second glass layer 20 may be chosen to considerably slow or prevent migration of electrically conductive metals, such as silver, through the resistance variable memory element 100.

Figure 7:
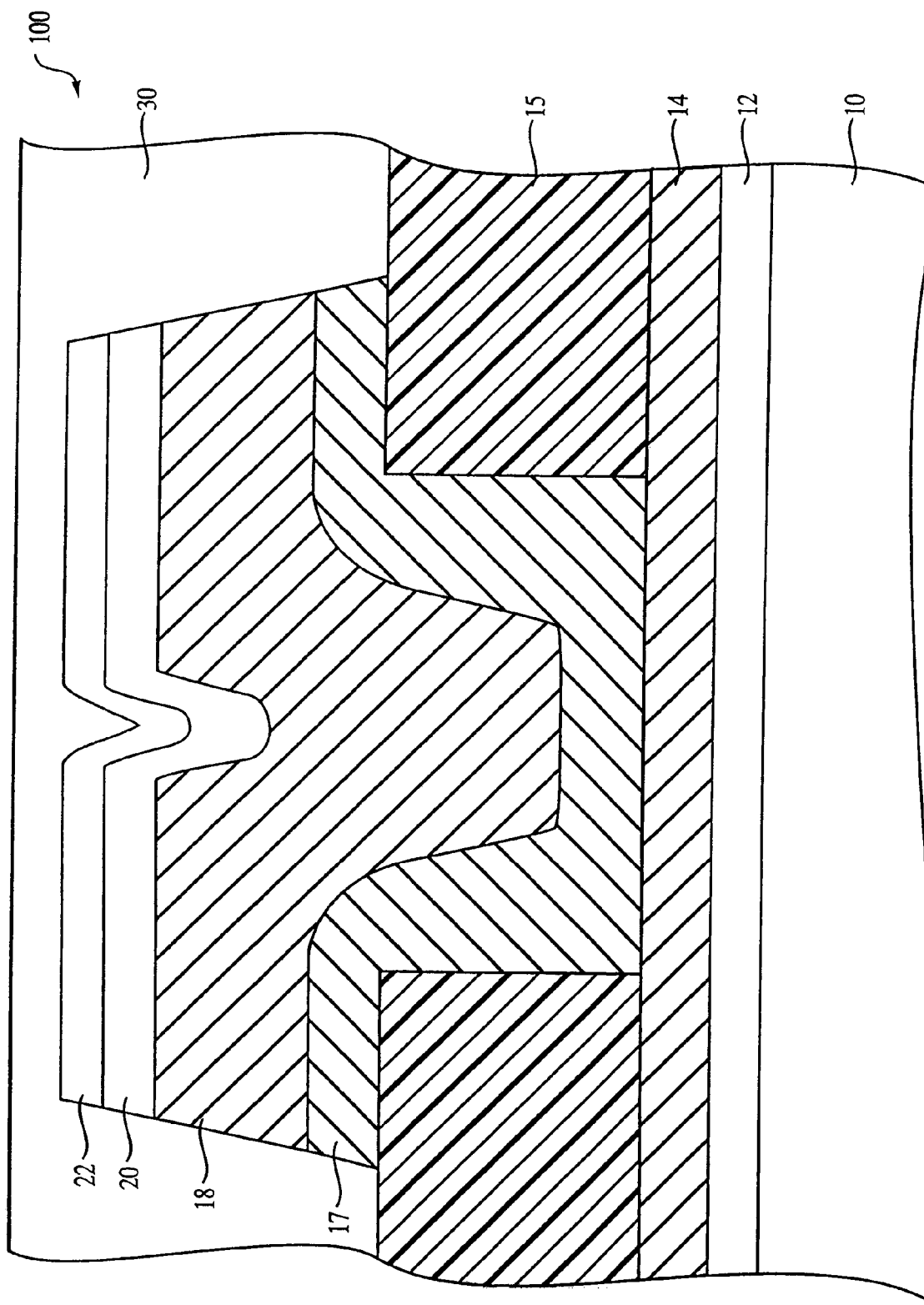
FIG. 7 illustrates a cross-sectional view of the memory element of FIG. 1 at a stage of processing subsequent to that shown in FIG. 6.

Referring now to FIG. 7, one or more additional dielectric layers 30 may be formed over the second electrode 22 and the first dielectric layer 15 to isolate the resistance variable memory element 100 from other structure fabrication over the substrate 10. Conventional processing steps can then be carried out to electrically couple the second electrode 22 to various circuits of memory arrays.

Figure 8:
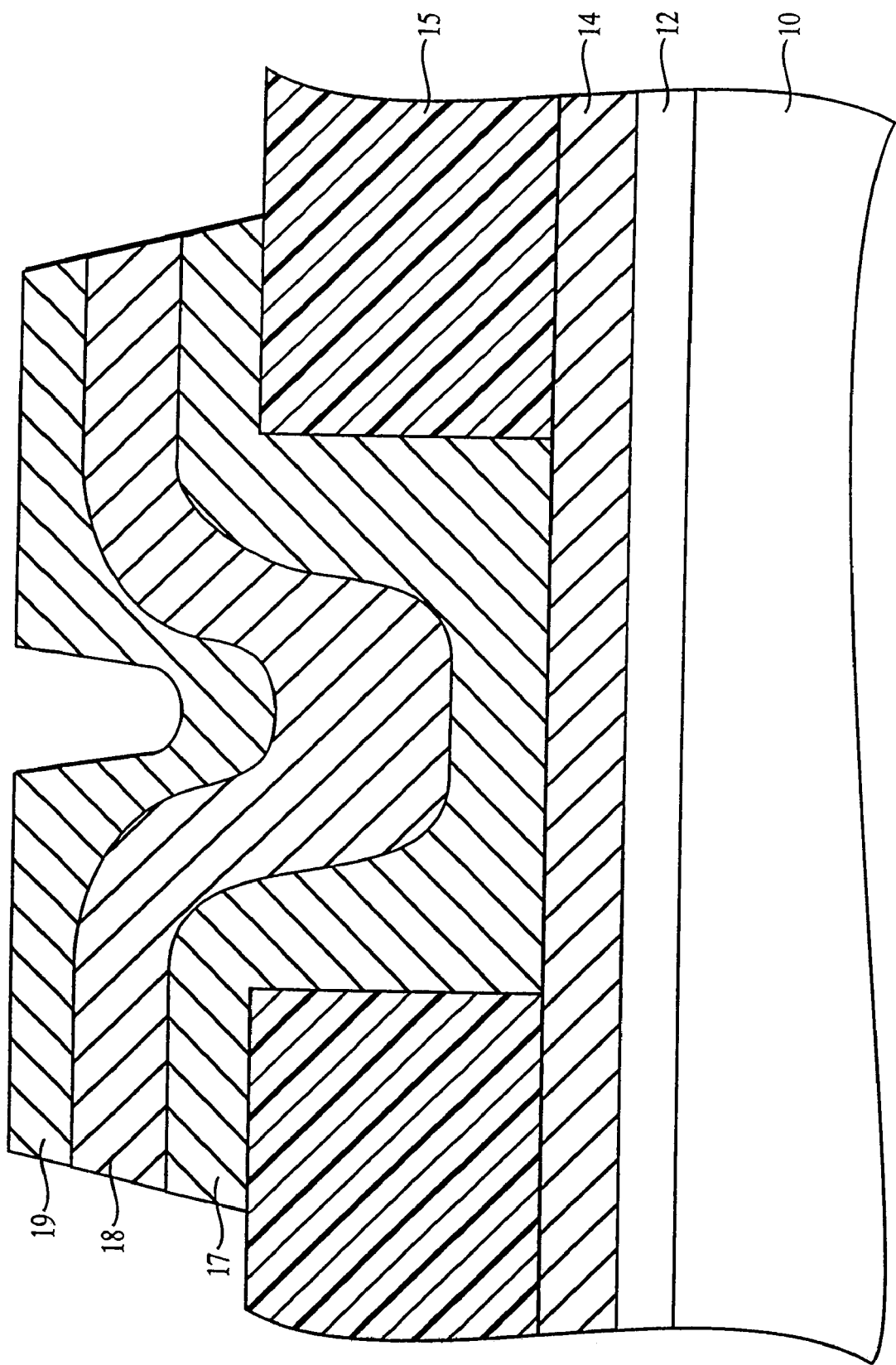
FIG. 8 illustrates a cross-sectional view of the memory element of FIG. 1 in accordance with a variation of the first embodiment of the invention at a stage of processing subsequent to that shown in FIG. 4.

In accordance with a variation of the first embodiment of the invention, one or more layers of a metal containing material, such as silver-selenide may be deposited on the first chalcogenide glass layer 17. Any number of silver-selenide layers may be used. As shown in FIG. 8, an optional second silver-selenide layer 19 may be deposited on the first silver-selenide layer 18 subsequent to the processing step shown in FIG. 4.

The thickness of the layers is such that the total thickness of the combined metal containing layers, e.g. silver-selenide layers, is greater than or equal to the thickness of the first chalcogenide glass layer. The total thickness of the combined metal containing layers is also greater than the thickness of a second glass layer. It is preferred that the total thickness of the combined metal containing layers is between about 1 to about 5 times greater than the thickness of the first chalcogenide glass layer and accordingly between about 1 to about 5 times greater than the thickness of the second glass layer. It is even more preferred that the total thickness of the combined metal containing layers is between about 2 to about 3.3 times greater than the thicknesses of the first chalcogenide glass layer and the second glass layer.

In accordance, with yet another variation of the invention, the first chalcogenide glass layer may comprise one or more layers of a chalcogenide glass material, such as germanium-selenide. The second glass layer may also comprise one or more layers of a glass material. Any suitable number of layers may be used to comprise the first chalcogenide glass layer and/or the second glass layer. However it is to be understood that the total thickness of the metal containing layer(s) should be thicker than the total thickness of the one or more layers of chalcogenide glass and additionally the total thickness of the metal containing layer(s) should be thicker than the total thickness of the one or more layers of the second glass layer. Preferably a ratio of the total thickness of the metal containing layer(s) to the total thickness of the one or more layers of chalcogenide glass is between about 5:1 and about 1:1. Also, preferably a ratio of the total thickness of the metal containing layer(s) to the total thickness of the one or more layers of the second glass is between about 5:1 and about 1:1. It is even more preferred that the total thickness of the metal containing layer(s) is between about 2 to about 3.3 times greater than the total thicknesses of the combined one or more layers of chalcogenide glass and the total thickness of the combined one or more layers of the second glass In accordance with yet another variant of the invention, one or more of the chalcogenide glass layers and second glass layers may also be doped with a dopant, such as a metal, preferably silver.

Figure 9:
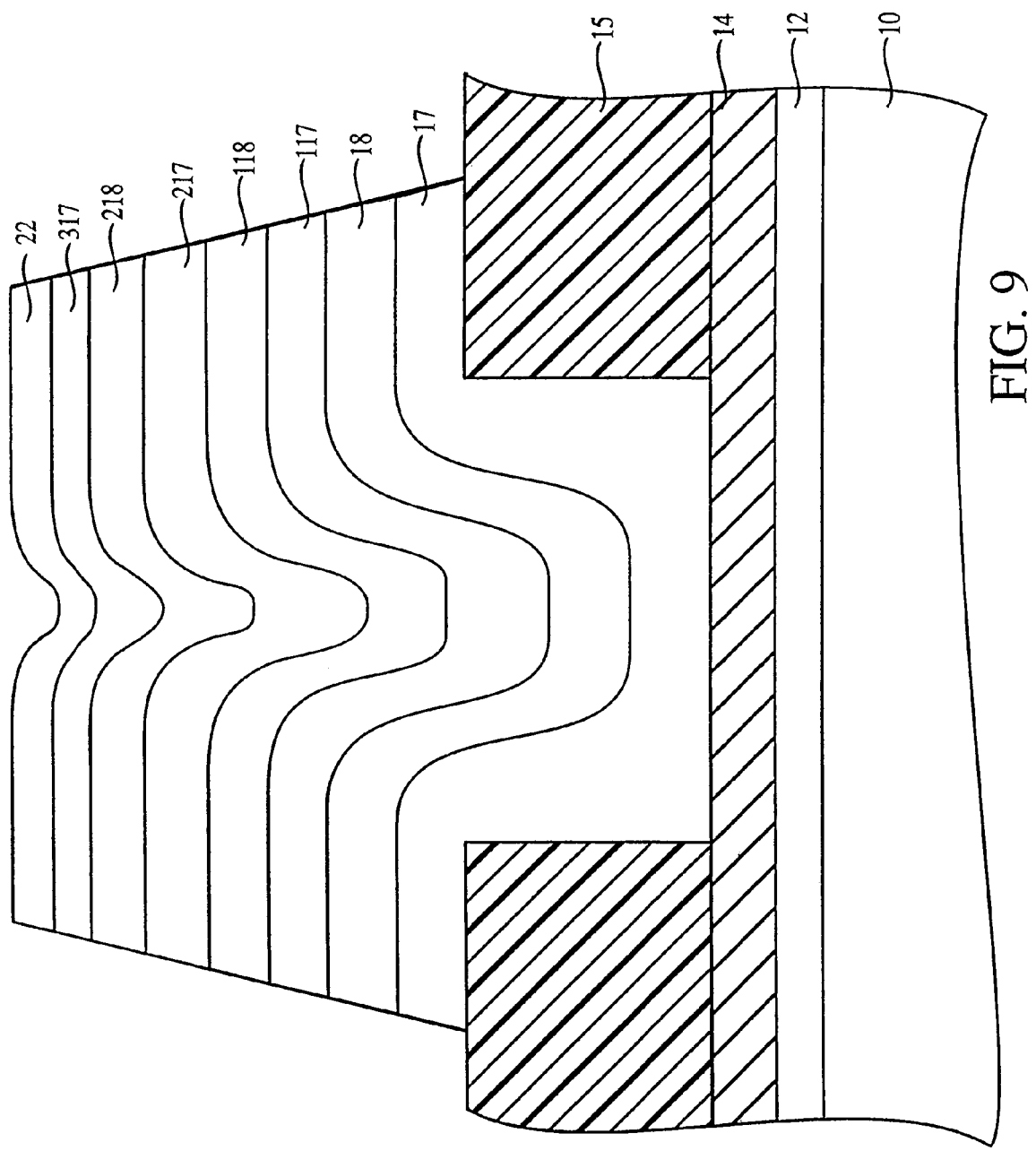
FIG. 9 illustrates a cross-sectional view of a second embodiment of the memory element of the invention at a stage of processing subsequent to that shown in FIG. 4.

Referring now to FIG. 9, which shows a second embodiment of the invention subsequent to the processing step shown in FIG. 4, the stack of layers formed between the first and second electrodes may include alternating layers of chalcogenide glass and a metal containing layer such as a silver-selenide layer. As shown in FIG. 9, a first chalcogenide glass layer 17 is stacked atop a first electrode 14, a first silver-selenide layer 18 is stacked atop the first chalcogenide glass layer 17, a second chalcogenide glass layer 117 is stacked atop the first silver-selenide layer 18, a second silver-selenide layer 118 is stacked atop the second chalcogenide glass layer 117, a third chalcogenide glass layer 217 is stacked atop the second silver-selenide layer 118, a third silver-selenide layer 218 is stacked atop the third chalcogenide glass layer 217, and a fourth chalcogenide glass layer is stacked atop the third silver-selenide layer 218. The second conductive electrode 22 is formed over the fourth chalcogenide glass layer.

In accordance with the second embodiment, the stack comprises at least two metal containing layers and at least three chalcogenide glass layers. However, it is to be understood that the stack may comprise numerous alternating layers of chalcogenide glass and silver-selenide, so long as the alternating layers start with a first chalcogenide glass layer and end with a last chalcogenide glass layer, with the first chalcogenide glass layer contacting a first electrode and the last chalcogenide glass layer contacting a second electrode. The thickness and ratios of the alternating layers of silver-selenide and chalcogenide glass are the same as described above, in that the silver-selenide layers are preferably thicker than connecting chalcogenide glass layers, in a ratio of between about 5:1 and about 1:1 silver-selenide layer to connected chalcogenide glass layer, and more preferably between about 3.3:1 and 2:1 silver-selenide layer to connected chalcogenide glass layer.

In a variation of the second embodiment, one or more layers of a metal containing material, such as silver-selenide may be deposited between the chalcogenide glass layers. Any number of silver-selenide layers may be used. As shown FIG. 10 at a processing step subsequent to that shown in FIG. 4, an additional silver-selenide layer 418 may be deposited on the first silver-selenide layer 18 and an additional silver-selenide layer 518 may be deposited on the third silver-selenide layer 218.

In accordance, with yet another variation of the invention, each of the chalcogenide glass layers may comprise one or more thinner layers of a chalcogenide glass material, such as germanium-selenide. Any suitable number of layers may be used to comprise the chalcogenide glass layers.

In yet another variation of the second embodiment of the invention, one or more of the chalcogenide glass layers may also be doped with a dopant such as a metal, preferably comprising silver.

Devices constructed according to the first embodiment of the invention, particularly, those having a silver-selenide layer disposed between two chalcogenide glass layers, show improved memory retention and write/erase performance over conventional memory devices. These devices have also shown low resistance memory retention better than 1200 hours at room temperature. The devices switch at pulse widths less than 2 nanoseconds compared with conventional doped resistance variable memory elements that switch at about 100 nanoseconds.

Although the embodiments described above refer to the formation of only one resistance variable memory element 100, it must be understood that the invention contemplates the formation of any number of such resistance variable memory elements, which can be fabricated in a memory array and operated with memory element access circuits.

Figure 10:
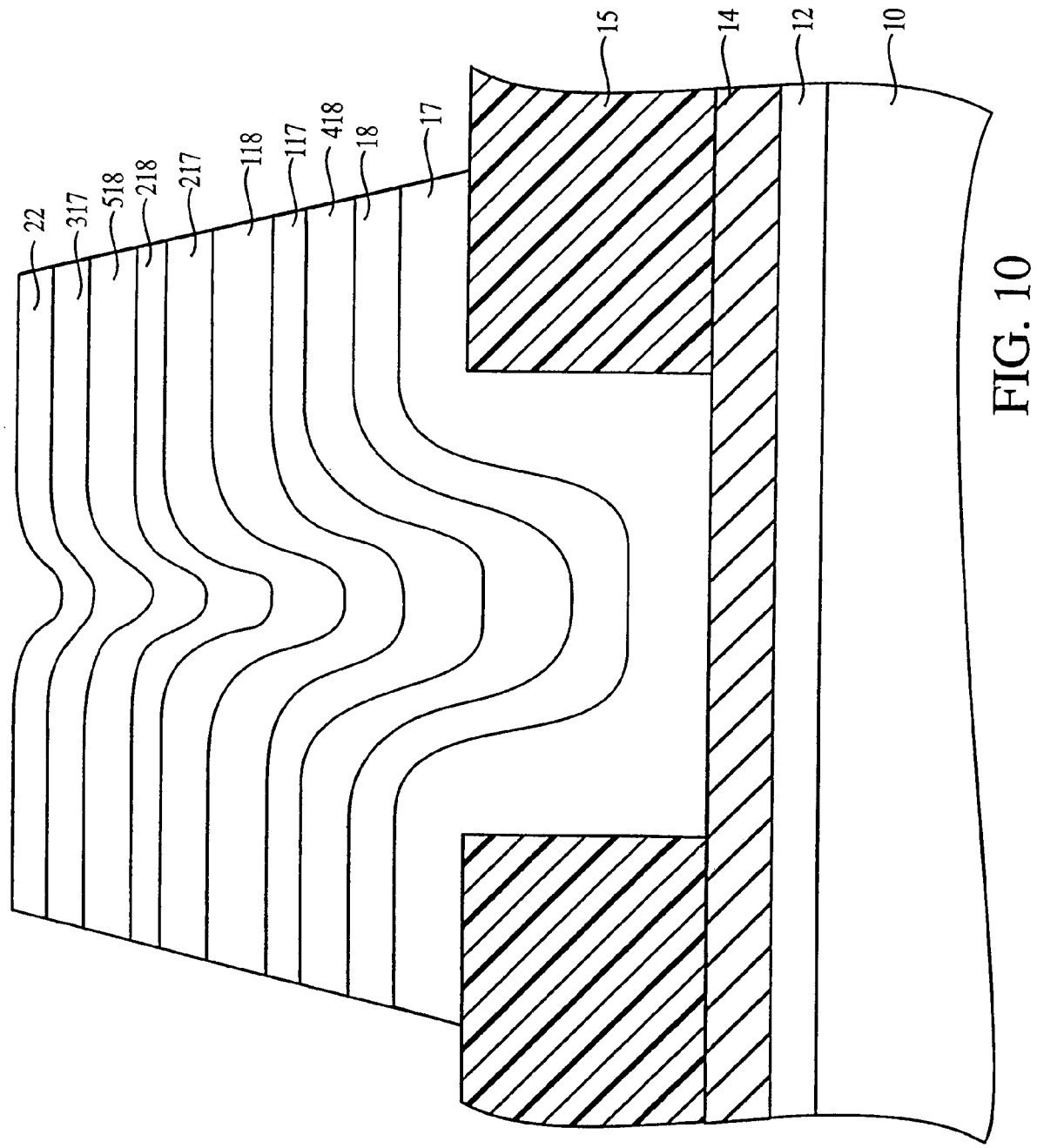
FIG. 10 illustrates a cross-sectional view of a variation of the second embodiment of the memory element of the invention at a stage of processing subsequent to that shown in FIG. 4.
Figure 11:
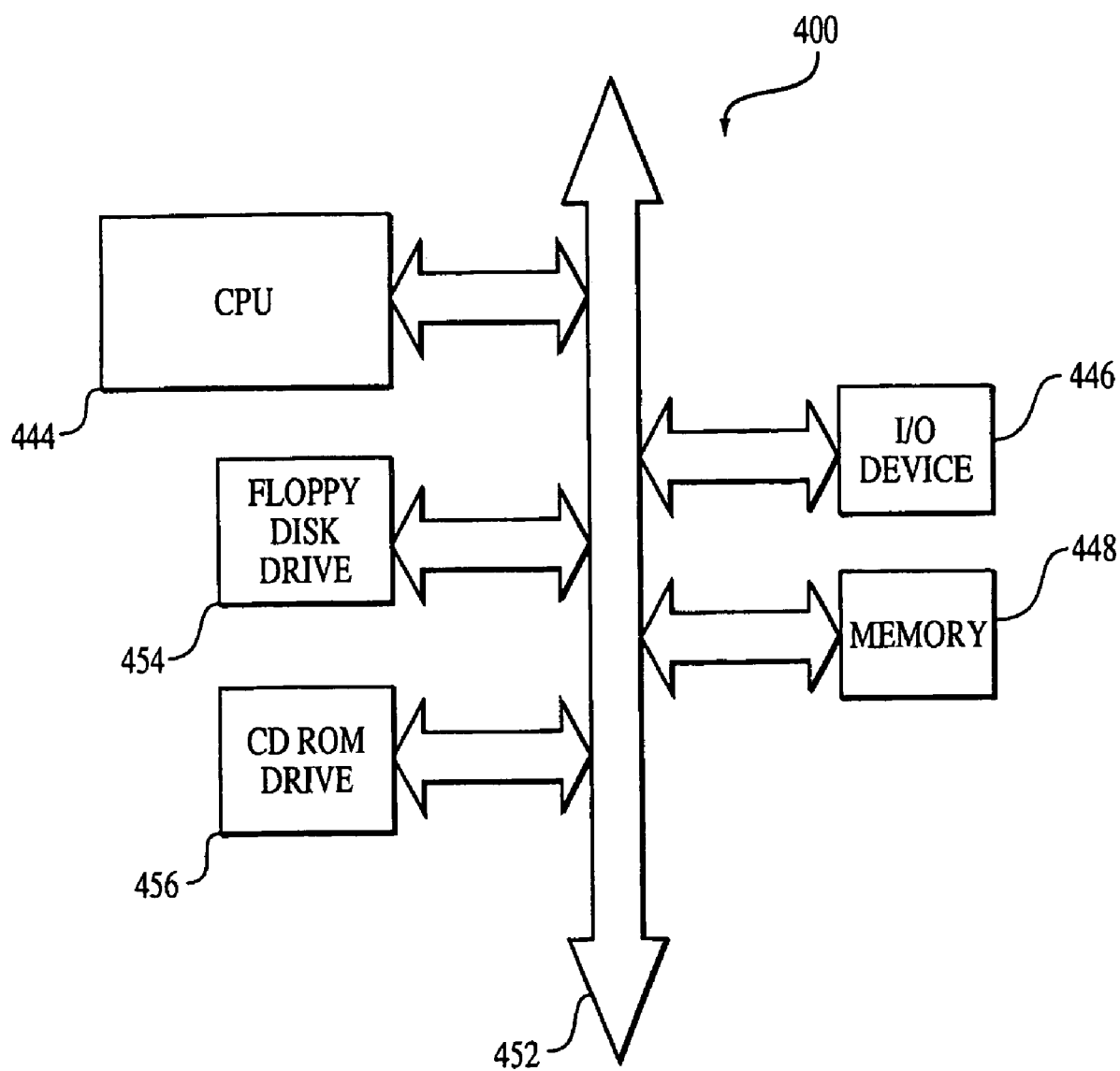
FIG. 11 illustrates a computer system having a memory element formed according to the invention.

FIG. 10 illustrates a typical processor-based system 400 which includes a memory circuit 448, for example a programmable conductor RAM, which employs resistance variable memory elements fabricated in accordance with the invention. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452 typically through a memory controller.

In the case of a computer system, the processor system may include peripheral devices such as a floppy disk drive 454 and a compact disc (CD) ROM drive 456, which also communicate with CPU 444 over the bus 452. Memory 448 is preferably constructed as an integrated circuit, which includes one or more resistance variable memory elements 100. If desired, the memory 448 may be combined with the processor, for example CPU 444, in a single integrated circuit.

The above description and drawings are only to be considered illustrative of exemplary embodiments which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A memory element comprising:
   a first electrode;
   at least one first chalcogenide glass layer in contact with said first electrode;
   at least one first metal containing layer in contact with said at least one first chalcogenide glass layer;
   at least one second chalcogenide glass layer in contact with said at least one first metal containing layer;
   at least one second metal containing layer in contact with said at least one second chalcogenide glass layer;
   at least one third chalcogenide glass layer in contact with said at least one second metal containing layer; and
   a second electrode in contact with said at least one third chalcogenide glass layer.

2. The memory element of claim 1 wherein said metal containing layers comprise one or more silver-selenide layers.

3. The memory element of claim 1 wherein one or more of said chalcogenide glass layers comprise a plurality of chalcogenide glass layers.

4. The memory element of claim 1 wherein one or more of said metal containing layers comprises a plurality of metal containing layers.

5. The memory element of claim 1 wherein one or more of said chalcogenide glass layers contains a metal dopant.

6. The memory element of claim 5 wherein said metal dopant comprises silver.

7. A method of forming a resistance variable memory element comprising the steps of:
   forming a first electrode;
   forming a first chalcogenide glass layer in contact with said first electrode;
   forming a first metal containing layer in contact with said first chalcogenide glass layer; and
   forming a second chalcogenide glass layer in contact with said first metal containing layer;
   forming a second metal containing layer in contact with said first chalcogenide glass layer;
   forming a third chalcogenide glass layer in contact with said second metal containing layer; and
   forming a second electrode in contact with said third chalcogenide glass layer.

8. The method of claim 7 wherein said chalcogenide glass layers comprise a material having the formula $Ge_xSe_{100-x}$, wherein x is between about 20 to about 43.

9. The method of claim 8 wherein said chalcogenide glass layers have a stoichiometry of about $Ge_{40}Se_{60}$.

10. The method of claim 7 wherein said chalcogenide glass layers comprise a plurality of chalcogenide glass layers.

11. The method of claim 7 wherein said metal containing layers comprise a plurality of metal containing layers.

12. The method of claim 7 wherein one or more of said chalcogenide glass layers contain a metal dopant.

13. The method of claim 12 wherein said metal dopant comprises silver.

14. The method of claim 7 wherein one or more of said metal containing layers comprises silver-selenide.

15. The method of claim 7 wherein said metal containing layers have a thickness which is equal to or greater than the thickness of each of said chalcogenide glass layers.

16. The method of claim 7 wherein each of said metal containing layers has a first thickness and each of said chalcogenide glass layers has a second thickness whereby a thickness ratio of said first thickness to said second thickness is between about 5:1 to about 1:1.

17. The method of claim 16 further wherein said thickness ratio of said first thickness to said second thickness is between about 3.3:1 to about 2:1.

18. A processor-based system, comprising:
   a processor;
   a memory circuit connected to said processor, said memory circuit including a first electrode;
   at least one first chalcogenide glass layer in contact with said first electrode;
   at least one first metal containing layer in contact with said at least one first chalcogenide glass layer;
   at least one second chalcogenide glass layer in contact with said at least one first metal containing layer;
   at least one second metal containing layer in contact with said at least one second chalcogenide glass layer;
   at least one third chalcogenide glass layer in contact with said at least one second metal containing layer; and
   a second electrode in contact with said at least one third chalcogenide glass layer.

19. The system of claim 18 wherein said metal containing layers comprise one or more silver-selenide layers.

20. The system of claim 18 wherein one or more of said chalcogenide glass layers comprise a plurality of chalcogenide glass layers.

21. The system of claim 18 wherein one or more of said metal containing layers comprises a plurality of metal containing layers.

22. The system of claim 18 wherein one or more of said chalcogenide glass layers contains a metal dopant.

23. The system of claim 22 wherein said metal dopant comprises silver.

24. A memory element comprising:
   a first electrode;
   a second electrode; and
   a plurality of chalcogenide glass layers and a plurality of metal containing layers between said first and second electrodes, whereby said plurality of chalcogenide glass layers alternate with said metal containing layers, with one of said chalcogenide glass layers in contact with said first electrode and another of said chalcogenide glass layers in contact with said second electrode.

25. The memory element of claim 24 wherein said plurality of metal containing layers comprises one or more silver-selenide layers.

26. The memory element of claim 24 wherein one or more of said plurality of chalcogenide glass layers comprises a plurality of chalcogenide glass layers.

27. The memory element of claim 24 wherein one or more of said plurality of metal containing layers comprises a plurality of metal containing layers.

28. The memory element of claim 24 wherein one or more of said plurality of chalcogenide glass layers contains a metal dopant.

29. The memory element of claim 28 wherein said metal dopant comprises silver.

30. A method of forming a resistance variable memory element comprising:
    forming a first electrode;
    forming a second electrode; and
    forming a plurality of chalcogenide glass layers and a plurality of metal containing layers between said first and second electrodes, whereby said plurality of chalcogenide glass layers alternate with said metal containing layers, with one of said chalcogenide glass layers in contact with said first electrode and another of said chalcogenide glass layers in contact with said second electrode.

31. The method of claim 30 wherein said plurality of metal containing layers comprises one or more silver-selenide layers.

32. The method of claim 30 wherein one or more of said plurality of chalcogenide glass layers comprises a plurality of chalcogenide glass layers.

33. The method of claim 30 wherein one or more of said plurality of metal containing layers comprises a plurality of metal containing layers.

34. The method of claim 30 wherein one or more of said plurality of chalcogenide glass layers contains a metal dopant.

35. The method of claim 34 wherein said metal dopant comprises silver.

36. A memory element, comprising:
    a first electrode;
    a second electrode; and
    a plurality of alternating layers of chalcogenide glass and metal-containing material between the first electrode and the second electrode, said plurality of alternating layers comprising at least one first chalcogenide glass layer in contact with said first electrode, at least one first metal containing layer, at least one second chalcogenide glass layer, and at least one second metal containing layer,
    wherein at least one of the chalcogenide glass layers and the metal-containing layers of the plurality of alternating layers comprises a plurality of sub-layers of respective chalcogenide glass material or metal-containing material in serial contact with each other and wherein at least one of the metal-containing material layers of the plurality of alternating layers is silver-selenide.

37. A method of forming a memory element, comprising:
    forming a first electrode;
    forming a second electrode; and
    forming a plurality of alternating layers of chalcogenide glass and metal-containing material between the first electrode and the second electrode, said plurality of alternating layers comprising at least one first chalcogenide glass layer in contact with said first electrode, at least one first metal containing layer, at least one second chalcogenide glass layer, and at least one second metal containing layer,
    wherein at least one of the chalcogenide glass layers and the metal-containing layers of the plurality of alternating layers comprises a plurality of sub-layers of respective chalcogenide glass material or metal-containing material in serial contact with each other and wherein at least one of the metal-containing material layers of the plurality of alternating layers is silver-selenide.

* * * * *

UNITED STATES PATENT AND TRADEMARK OFFICE
CERTIFICATE OF CORRECTION

PATENT NO. : 7,646,007 B2
APPLICATION NO. : 11/585259
DATED : January 12, 2010
INVENTOR(S) : Kristy A. Campbell et al.

It is certified that error appears in the above-identified patent and that said Letters Patent is hereby corrected as shown below:

In column 10, line 28, in Claim 17, before "wherein" delete "further".

Signed and Sealed this

First Day of June, 2010

David J. Kappos
*Director of the United States Patent and Trademark Office*

UNITED STATES PATENT AND TRADEMARK OFFICE
CERTIFICATE OF CORRECTION

PATENT NO.      : 7,646,007 B2                                              Page 1 of 1
APPLICATION NO. : 11/585259
DATED           : January 12, 2010
INVENTOR(S)     : Campbell et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 197 days.

Signed and Sealed this

Sixteenth Day of November, 2010

David J. Kappos
*Director of the United States Patent and Trademark Office*